Sept. 28, 1965 G. L. CLAPPER 3,209,283

GATED OSCILLATOR WITH VARIABLE AMPLITUDE CONTROL

Filed Nov. 13, 1961 2 Sheets-Sheet 1

INVENTOR
GENUNG L. CLAPPER

BY Donald F Voss
ATTORNEY

Sept. 28, 1965 G. L. CLAPPER 3,209,283
GATED OSCILLATOR WITH VARIABLE AMPLITUDE CONTROL
Filed Nov. 13, 1961 2 Sheets-Sheet 2

United States Patent Office 3,209,283
Patented Sept. 28, 1965

3,209,283

GATED OSCILLATOR WITH VARIABLE AMPLITUDE CONTROL

Genung L. Clapper, Vestal, N.Y., assignor to International Business Machines Corporation, New York, N.Y., a corporation of New York Filed Nov. 13, 1961, Ser. No. 151,775
6 Claims. (Cl. 331—109)

This invention relates to an oscillator and, more particularly, to an oscillator whose amplitude can be changed without a change of frequency of oscillation and, still more particularly, to a gated oscillator having a low impedance output which can be mixed with the output of one or more like oscillators without any interaction between the oscillators.

Heretofore, oscillators were operated either in an on or off state; there was no control over the rate of buildup or amplitude of the output signal. Most prior art oscillators have a transient frequency change. In the present invention, the output waveform is substantially undistorted for the full range of amplitudes. This is possible because the amplitude may be raised or lowered very smoothly. The oscillator of the present invention has the ability to drive a low impedance load and has a current mode output that allows the outputs of a plurality of oscillators embodying the instant invention to mix with each other without any interaction between the oscillators. By this arrangement, the outputs from several oscillators can be combined to produce a composite waveform.

The gated oscillator with amplitude control of the present invention is particularly suited to be incorporated into apparatus for synthesizing speech. Such apparatus requires the production of particular composite waveforms to allow the generation of "vowel sounds." The natural effects can be achieved because the oscillator can be gated on with a controllable buildup and fall off of the amplitude. Of course, the invention is not limited to such an application and it generally finds utility in any arrangement of apparatus which requires control over the amplitude without a change in frequency and particularly where the oscillator is gated so as to permit its output to be selectively mixed with the outputs of other oscillators to develop a composite complex waveform.

Accordingly, a prime object of the invention is to provide an oscillator whose amplitude can be changed without changing the frequency of oscillation.

Another very important object of the invention is to provide an oscillator which may be gated on or off with control over the rate of change of the amplitude.

Still another very important object of the invention is to provide an oscillator having an output waveform which is substantially undistorted for the full range of amplitudes.

A more specific object of the invention is to provide an oscillator which is able to drive a low impedance load.

Still a more specific object of the invention is to provide an oscillator which has a current mode output that allows the outputs of a plurality of like oscillators to mix with each other without any interaction between the oscillators.

Another object of the invention is to provide an oscillator which can be gated and where the gating action can be controlled precisely for the full range of amplitudes.

The foregoing and other objects, features and advantages of the invention will be apparent from the following more particular description of preferred embodiments of the invention, as illustrated in the accompanying drawings.

*General*

The oscillator of the present invention is constructed to operate according to Barkhausen oscillator fundamentals. These fundamentals require that the oscillator feedback loop have a power gain and at least a unity voltage gain. There must be either no phase shift or a 360° phase shift.

The oscillator includes a regenerative path having connected therein a filter meeting the requirements of a broad-band filter and a degenerative path having a filter which meets the requirements of a narrow band within the broad band. The filter in the degenerative feedback path must have a notch or null characteristic. This not only stabilizes the frequency of oscillation, but it also improves the waveform because it will restore the waveform if there is any tendency to clip the same. By this arrangement, the regenerative feedback path, or a positive feedback path, through the broad-band filter becomes the oscillation controlling element in conjunction with an input gate. The degenerative feedback path accurately determines the frequency. The input gate includes a gate control and a control for controlling the amplitude of the waveform. The gate control, in combination with the amplitude control, controls the turning on of the oscillator. As it will be seen later herein, the low impedance or current output of one oscillator can be combined with that of another oscillator. The combining of outputs can be done selectively because of the input gate. The amplitude control permits selective buildup and fall off of the output of each oscillator and, consequently, the selective buildup and fall off of the combined output waveform.

*Detailed description*

Figure 1:
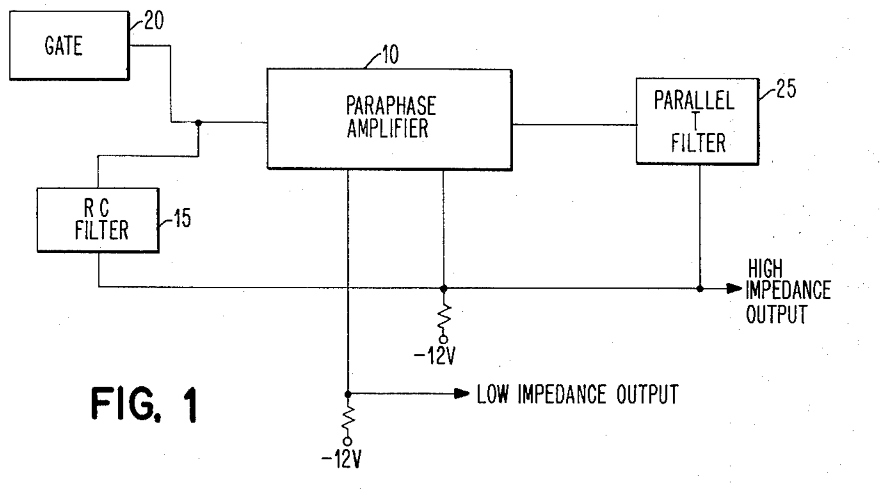
FIG. 1 is a schematic block diagram of the gated oscillator embodying the present invention.

With reference to the drawings and particularly to FIG. 1, the invention is illustrated by way of example as including a paraphase amplifier 10 which has an RC filter network 15 connected in the regenerative feedback path. The RC filter 15 meets the requirements of a broad-band filter and is the oscillation controlling element in conjunction with input gate 20.

Figure 6:
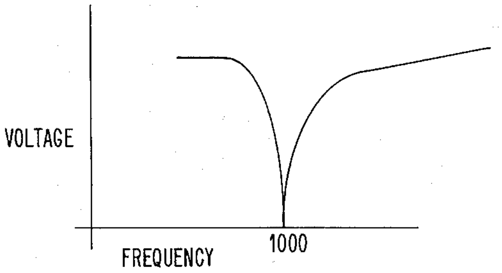

The degenerative feedback path includes a parallel T filter 25 which meets the requirements of a narrow-band filter within the broad-band filter 15. Therefore, the degenerative feedback path becomes the frequency determining element. The parallel T filter 25 is a filter having a notch or null characteristic, as shown in FIG. 6. Because of this characteristic, the degenerative feedback path tends to improve or restore the output of the oscillator if the same has been distorted.

The paraphase amplifier 10, in FIG. 1, includes two controllable current conducting devices 11 and 12 which, in this example, are PNP alloy junction transistors. The transistor 11 is connected in an emitter-follower configuration, while the transistor 12 is connected in a grounded base configuration. The emitters of transistors 11 and 12 are commonly connected through a current limiting resistor 13 to a positive electrical potential and, in this example, it is plus 6 volts. The collector of transistor 11 is connected to a negative electrical potential of minus 12 volts through a relatively low impedance load resistor 14. The collector of the transistor 12 is connected to a resistor 16 of the RC filter network 15 and to a capacitor 26 of the parallel T filter network 25. The collector of the transistor 12 is also connected to a minus 12 volts through a resistor 18. The resistor 16 is connected in series to a capacitor 17 which in turn is connected to the base of the transistor 11. Hence, the resistor 16 and capacitor 17 are the oscillation controlling elements in conjunction with the gate 20.

Figure 2:
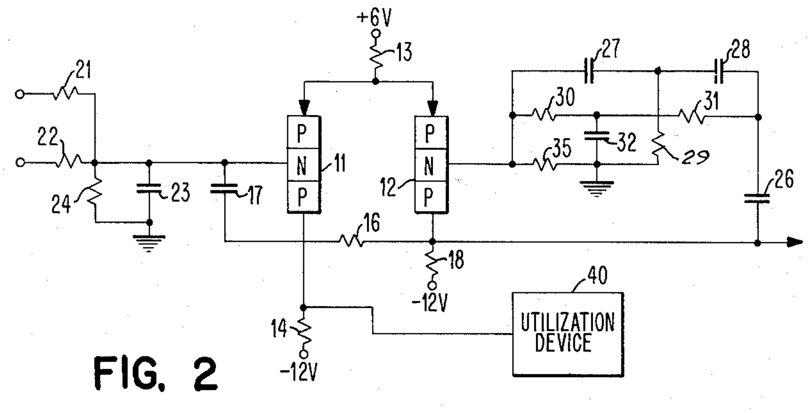
FIG. 2 is a schematic circuit diagram of the gated oscillator shown in FIG. 1 and incorporating a utilization device represented by a block.
Figure 3:
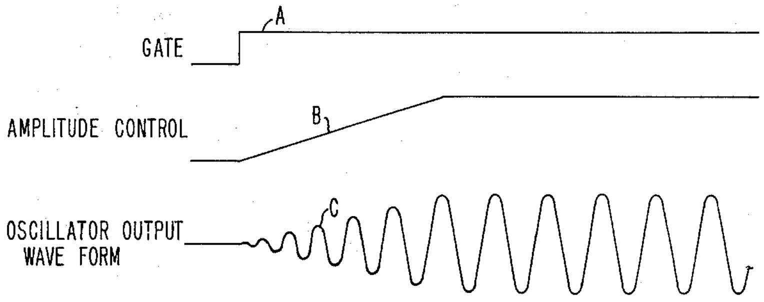
FIG. 3 is a schematic diagram illustrating the gates for controlling the oscillator and the oscillator output waveform.

The gate 20 includes a resistor 21 connected to a terminal for receiving a gate control signal A, shown in FIG. 3, and in parallel with a resistor 22, FIG. 2. The resistor 22 is connected between a terminal for receiving an amplitude control signal B, FIG. 3, and the base of the transistor 11, FIG. 2. Capacitor 23 and resistor 24 are connected in parallel to ground and to the base of the transistor 11 so as to smooth out the signals applied to resistors 21 and 22. Capacitors 27 and 28 and resistor 29 are connected in a T configuration to form a high-pass filter in the degenerative feedback path of the transistor 12. Resistors 30 and 31 and capacitor 32 are connected in a T configuration to form a low-pass filter. The two T filter networks are connected in parallel. The base of transistor 12 is connected to ground through a resistor 35 and is also connected to the parallel T filters. The transistor 11 has a voltage gain of nearly unity and a current gain of more than unity. Transistor 12 has a current gain of nearly unity and a voltage gain of more than unity. The low impedance output is taken from the collector of transistor 11 which is connected to a utilization device 40. The high impedance output is taken from the collector of transistor 12.

When gate A, FIG. 3, applied to resistor 21, FIG. 2, is down or at a lower level, the transistor 11 is conducting. As the gate A and the amplitude control signal B simultaneously rise, the amount of current permitted to flow in the transistor 11 is reduced and a portion of the current flows through transistor 12. This causes the potential of the collector of transistor 12 to rise. The rise in potential at the collector of transistor 12 produces a transient rise in potential at the base of transistor 11 through the regenerative feedback path formed by resistor 16 and capacitor 17. The charge on capacitor 17 soon reduces and the negative change in potential at the base of transistor 11 now results in a negative change in potential at the collector of transistor 12 which regenerates through the feedback loop until a state of equilibrium is attained, as determined by the gating resistors 21 and 22. Capacitor 17 now charges through the gate and the rise in potential at the base of transistor 11 crates a rise in potential at the collector of transistor 12, and the cycle described above repeats. This action continues so long as the gate A, FIG. 3, is up.

The oscillator output is represented by curve C, FIG. 3. In this particular example, the amplitude control signal B, FIG. 3, first increases, then reaches a steady state, and remains at the steady state for a predetermined period of time.

Figure 4:
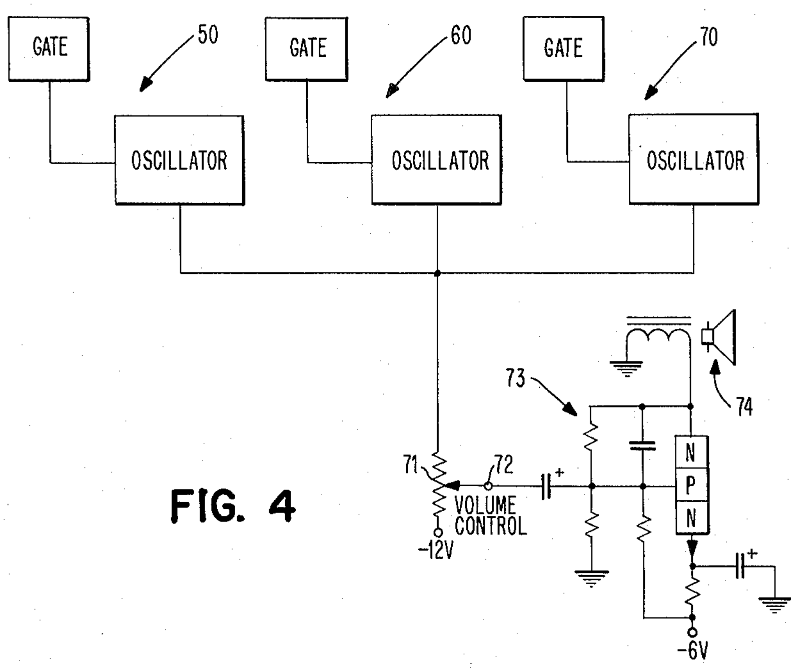
FIG. 4 is a schematic diagram wherein the outputs of a plurality of oscillators are connected to mix with each other to produce a composite or complex waveform which is amplified to drive a loudspeaker.
Figure 5:
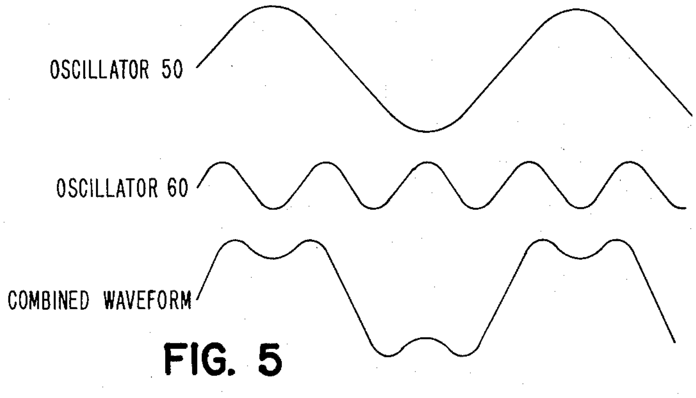
FIG. 5 is a diagram illustrating the individual outputs from two oscillators and the waveform resulting from mixing the outputs of these two oscillators; and, FIG. 6 is a schematic diagram showing the null characteristic of the parallel T filter in the degenerative feedback path.

In FIG. 4, a plurality of gated oscillators 50, 60 and 70 have their low impedance outputs commonly connected to a resistor 71 of a volume control element 72. The volume control element 72 is connected to a self-biased amplifier 73 which, in turn, is connected to a loudspeaker 74. By this arrangement, the outputs of oscillators 50, 60 and 70 are combined selectively to produce a composite waveform. Since the gates associated with the oscillators 50, 60 and 70 may be operated selectively, any combination of mixed outputs can be obtained. The composite waveform obtained by mixing the outputs of oscillators 50 and 60 is shown in FIG. 5.

From the foregoing, it is seen that the invention provides an oscillator whose amplitude can be changed without changing the frequency of oscillation. Further, it is seen that the oscillator can be gated on or off and that the amplitude may be controlled. It is also seen that the outputs of a plurality of like oscillators can be mixed with each other without any interaction between the oscillators.

While the invention has been particularly shown and described with reference to preferred embodiments thereof, it will be understood by those skilled in the art that various changes in form and details may be made therein without departing from the spirit and scope of the invention.

What is claimed is:

1. An oscillator comprising:

a pair of current conducting devices connected to a source of current, a regenerative feedback circuit connected between the output of one of said current conducting devices and the input of the other to form an oscillation control element, and a degenerative feedback circuit directly connected between the output and input of said one current conducting device to form a frequency controlling element.

2. An oscillator according to claim 1 wherein said regenerative feedback circuit consists of a resistor and capacitor connected in series.

3. An oscillator according to claim 1 wherein said degenerative feedback circuit includes a parallel T filter.

4. A gated oscillator with variable amplitude control comprising:

a pair of current conducting devices connected to a source of current;

a first resistor connected to the input of one of said current conducting devices and responsive to a gate control signal for controlling the current flowing in said one of said current conducting devices;

a second resistor connected in parallel with said first resistor and to said input of said one current conducting device and responsive to an amplitude control signal for further controlling current flow in said one current conducting device;

a regenerative feedback circuit connected between the output of the other of said current conducting devices and said input of said one current conducting device to form an oscillation control element; and a degenerative feedback circuit connected between the output and input of said other current conducting device to form a frequency controlling element.

5. An oscillator comprising:

first and second transistors, each having a collector, emitter and base;

a regenerative feedback circuit connected between the collector of said second transistor and the base of said first transistor to form an oscillation control element; and a degenerative feedback circuit connected between the collector and the base of said second transistor to form a frequency controlling element without interfering with the operation of said oscillation control element.

6. A gated oscillator with variable amplitude control comprising:

first and second transistors each having a collector, emitter and base;

a pair of resistors connected in parallel with each other and to the base of said first transistor to control the conduction of current therein in response to control signals being applied to said resistors;

a regenerative feedback circuit connected between the collector of said second transistor and the base of said first transistor to further control the current flow in said first transistor and thereby form an oscillation control element; and a degenerative feedback circuit connected between the collector and base of said second transistor to form a frequency controlling element.

References Cited by the Examiner

UNITED STATES PATENTS

| | | | |
|---|---|---|---|
| 2,139,023 | 12/38 | Kock | 331—49 |
| 2,586,167 | 2/52 | Hamm | 331—183 |
| 2,764,643 | 9/56 | Sulzer | 331—109 |
| 2,954,527 | 9/60 | Bradmiller | 331—109 |

ROY LAKE, *Primary Examiner.*